(12) United States Patent
Rascuna' et al.

(10) Patent No.: US 12,334,346 B2
(45) Date of Patent: Jun. 17, 2025

(54) METHOD FOR MANUFACTURING A SiC ELECTRONIC DEVICE WITH REDUCED HANDLING STEPS, AND SIC ELECTRONIC DEVICE

(71) Applicant: STMicroelectronics S.r.l., Agrate Brianza (IT)

(72) Inventors: Simone Rascuna', Catania (IT); Paolo Badala', Acireale (IT); Anna Bassi, Gravina di Catania (IT); Mario Giuseppe Saggio, Aci Bonaccorsi (IT); Giovanni Franco, Viagrande (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 18/459,273

(22) Filed: Aug. 31, 2023

(65) Prior Publication Data

US 2023/0411158 A1     Dec. 21, 2023

Related U.S. Application Data

(62) Division of application No. 17/190,722, filed on Mar. 3, 2021, now Pat. No. 11,784,049.

(30) Foreign Application Priority Data

Mar. 5, 2020   (IT) ........................ 102020000004696

(51) Int. Cl.
   *H01L 21/04*     (2006.01)
   *H10D 62/832*    (2025.01)
   (Continued)

(52) U.S. Cl.
   CPC ...... *H01L 21/0485* (2013.01); *H01L 21/0495* (2013.01); *H10D 62/8325* (2025.01); *H10D 64/62* (2025.01); *H10D 64/64* (2025.01)

(58) Field of Classification Search
   CPC . H01L 21/0485; H01L 21/0495; H10D 8/051; H10D 8/60; H10D 62/106; H10D 62/8326; H10D 64/62; H10D 64/64
   See application file for complete search history.

(56) References Cited

U.S. PATENT DOCUMENTS 6,747,291 B1   6/2004   Lu et al.
8,962,468 B1   2/2015   Hostetler
(Continued)

FOREIGN PATENT DOCUMENTS

CN   102124567 A   7/2011
CN   103117298 A   5/2013
(Continued)

OTHER PUBLICATIONS

Badala, P. et al., "Ni/4H—SiC interaction and silicide formation under excimer laser annealing for ohmic contact," *Materialia 9 100528*, 2020, 6 pages.
(Continued)

*Primary Examiner* — Fazli Erdem
(74) *Attorney, Agent, or Firm* — Seed IP Law Group LLP

(57) ABSTRACT

A method for manufacturing an electronic device based on SiC includes forming a structural layer of SiC on a front side of a substrate. The substrate has a back side that is opposite to the front side along a direction. Active regions of the electronic device are formed in the structure layer, and the active regions are configured to generate or conduct electric current during the use of the electronic device. A first electric terminal is formed on the structure layer, and an intermediate layer is formed at the back side of the substrate. The intermediate layer is heated by a LASER beam in order to generate local heating such as to favor the formation of an
(Continued)

ohmic contact of Titanium compounds. A second electric terminal of the electronic device is formed on the intermediate layer.

20 Claims, 8 Drawing Sheets

(51) Int. Cl.
  *H10D 64/62* (2025.01)
  *H10D 64/64* (2025.01)

(56) References Cited

U.S. PATENT DOCUMENTS

| | | |
|---|---|---|
| 2005/0104072 A1 | 5/2005 | Slater et al. |
| 2006/0192256 A1 | 8/2006 | Cooper et al. |
| 2007/0066039 A1 | 3/2007 | Agarwal et al. |
| 2008/0099769 A1 | 5/2008 | Rupp et al. |
| 2009/0289262 A1* | 11/2009 | Zhang .................. H01L 29/872 257/E21.057 |
| 2011/0266558 A1* | 11/2011 | Yano .................. H01L 29/6606 257/77 |
| 2013/0020585 A1 | 1/2013 | Ishibashi |
| 2013/0062620 A1 | 3/2013 | Henning et al. |
| 2013/0313573 A1 | 11/2013 | Mizukami et al. |
| 2015/0091022 A1* | 4/2015 | Kawaguchi ......... H01L 21/0495 438/653 |
| 2015/0214164 A1* | 7/2015 | Matocha ................. H01L 23/26 257/77 |
| 2015/0372093 A1 | 12/2015 | Saggio et al. |
| 2016/0181388 A1* | 6/2016 | Konrath ............. H01L 29/0619 257/486 |
| 2017/0077087 A1 | 3/2017 | Horikawa et al. |
| 2017/0170280 A1 | 6/2017 | Wakabayshi et al. |
| 2017/0271324 A1 | 9/2017 | Kumagai |
| 2017/0309720 A1 | 10/2017 | Joshi et al. |
| 2018/0019309 A1 | 1/2018 | Radhakrishnan et al. |
| 2018/0097103 A1 | 4/2018 | Sadamatsu et al. |
| 2018/0175153 A1 | 6/2018 | Schulze et al. |
| 2018/0190651 A1 | 7/2018 | Siemieniec et al. |
| 2019/0081170 A1 | 3/2019 | Kumagai |
| 2020/0044031 A1 | 2/2020 | Pham et al. |
| 2020/0083365 A1* | 3/2020 | Konstantinov ..... H01L 29/7806 |
| 2020/0258996 A1* | 8/2020 | Ohse ................... H01L 21/0485 |
| 2020/0303564 A1 | 9/2020 | Rascuna'et al. |
| 2021/0167196 A1 | 6/2021 | Matsunaga |
| 2021/0280424 A1 | 9/2021 | Rascuna'et al. |
| 2021/0328022 A1 | 10/2021 | Rascunáet al. |
| 2021/0328023 A1 | 10/2021 | Rascunáet al. |
| 2021/0399154 A1 | 12/2021 | Rascunáet al. |
| 2023/0282757 A1 | 9/2023 | Rascunáet al. |
| 2023/0343831 A1 | 10/2023 | Rascuna'et al. |

FOREIGN PATENT DOCUMENTS

| | | |
|---|---|---|
| CN | 106471605 A | 3/2017 |
| CN | 109037041 A | 12/2018 |
| CN | 109326657 A | 2/2019 |
| JP | 2011071281 A | 4/2011 |
| JP | 2014063948 A | 4/2014 |
| JP | 2014127660 A | 7/2014 |
| JP | 2015153789 A | 8/2015 |
| JP | 2015153960 A | 8/2015 |
| JP | 2018110234 A | 7/2018 |
| WO | 2015178024 A1 | 11/2015 |

OTHER PUBLICATIONS

Kusdemir, E. et al., "Epitaxial graphene contact electrode for silicon carbide based ultraviolet photodetector," *Journal of Phys. D: Appl. Phys. vol. 48*, 2015, p. 1-6.

Lebedev, A. et al., "Low temperature transport properties of multigraphene structures on 6H—SiC obtained by thermal graphitization: evidences of a presence of nearly perfect graphene layer," *Cornell University* URL=https://arxiv.org/abs/1212.4272, downloaded on Dec. 18, 2012, 8 pages.

Lemaitre, M. et al., "Low-temperature, site selective graphitization of SiC via ion implantation and pulsed laser annealing," *Applied Physics Letters, vol. 100*, May 8, 2012, p. 193105-1-193105-4.

Lioliou, G. et al., "Electrical and ultraviolet characterization of 4H—SiC Schottky photodiodes," Optics Express 21657, vol. 23, No. 17, 2015, 14 pages.

Liu et al., "Visible blind p+/p/n−/n+ UV 4H—SiC photodiodes based on 4H—SiC homeopilayers," *2006 8th International Conference on Solid-State and Integrated Circuit Technology Proceedings*, Oct. 2006, pp. 866-868.

Liu, F. et al., "Enhanced Ohmic contact via graphitization of polycrystalline silicon carbide," *Applied Physics Letters, vol. 97*, 2010, p. 262107-1-262107-3.

Lu, W. et al., "Catalytic graphitization and Ohmic contact formation on 4H—SiC," *Journal of Applied Physics, vol. 93*, No. 9, May 1, 2003 p. 5397-5403.

Mazzamuto, F. et al., "Low thermal budget ohmic contact formation by laser anneal," *Materials Science Forum, vol. 858*, 2016, 4 pages.

Rascuna, S. et al., "Morphological and electrical properties of Nickel based Ohmic contacts formed by laser annealing process on n-type 4H—SiC," *Manuscript submitted to Materials Science in Semiconductor Processing*, Nov. 20, 2018, 7 pages.

Palmour et al., "Silicon carbide for power devices," Proceedings of 9th International Symposium on Power Semiconductor Devices and IC's, May 26-29, 1997, available online Aug. 6, 2002, 8 pages.

U.S. Appl. No. 17/225,998, filed Apr. 8, 2021.
U.S. Appl. No. 17/226,003, filed Apr. 8, 2021.
U.S. Appl. No. 18/309,584, filed Apr. 28, 2023.
U.S. Appl. No. 17/344,558, filed Jun. 10, 2021.
U.S. Appl. No. 18/181,409, filed Mar. 9, 2023.

* cited by examiner

METHOD FOR MANUFACTURING A SiC ELECTRONIC DEVICE WITH REDUCED HANDLING STEPS, AND SIC ELECTRONIC DEVICE

BACKGROUND

Technical Field

The present disclosure relates to a method for manufacturing a SiC electronic device, and a SiC electronic device thus manufactured. In particular, the present disclosure relates to an enhanced method for forming an ohmic contact on the back of the electronic device, requiring a reduced number of handling ("flipping") steps of the device.

Description of the Related Art

As is known, semiconductor materials, which have a wide band gap, in particular, which have an energy value Eg of the band gap greater than 1.1 eV, low on-state resistance ($R_{ON}$), high value of thermal conductivity, high operating frequency and high saturation velocity of charge carriers, are ideal for producing electronic components, such as diodes or transistors, in particular for power applications. A material having said characteristics, and designed to be used for manufacturing electronic components, is silicon carbide (SiC). In particular, silicon carbide, in its different polytypes (for example, 3C—SiC, 4H—SiC, 6H—SiC), is preferable to silicon as regards the properties listed previously.

Electronic devices provided on a silicon-carbide substrate, as compared to similar devices provided on a silicon substrate, present numerous advantages, such as low output resistance in conduction, low leakage current, high working temperature, and high working frequencies. In particular, SiC Schottky diodes have demonstrated higher switching performance, making SiC electronic devices especially favorable for high frequency applications. Current applications impose requirements on electrical properties and also on long-term reliability of devices.

The value of resistance $R_{ON}$ depends on several contributions. For example, in a SiC Schottky diode (e.g., 4H—SiC), configured to operate at voltages of 650V and provided with a SiC substrate with a thickness equal to a few hundred micrometres (e.g., 350 μm), about 70% of the total value of resistance $R_{ON}$ is given by the SiC substrate. As a result, reducing the thickness of the SiC substrate to values proximate to a hundred micrometres (e.g., 110 μm) allows the contribution given by the substrate to the total value of resistance $R_{ON}$ to be significantly reduced (taking such contribution to a value of about 44%). Therefore, for medium voltage applications (600-1200V), a grinding process of the wafer at a back side of the SiC substrate is considered suitable, if not even necessary.

However, such a processing step poses serious problems of handling and processing the wafer, which may turn out to be excessively thin and thus subject to cracking, warping or, in general, damage phenomena.

FIG. 1 shows, in lateral section view in a Cartesian (tri-axial) reference system of axes X, Y, Z, a Merged-PN-Schottky (MPS) device 1 of a known type.

The MPS device 1 includes: a substrate 3, of N-type SiC, having a first doping concentration, provided with a surface 3a opposite to a surface 3b, and thickness equal to about 350 μm; a drift layer (grown in an epitaxial manner) 2, of N-type SiC, having a second doping concentration lower than the first doping concentration, extending on the surface 3a of the substrate 3, and a thickness in the range 5-10 μm; an ohmic contact region 6 (for example of Nickel Silicide), extending on the surface 3b of the substrate 3; a cathode metallization 16, extending on the ohmic contact region 6; an anode metallization 8 extending on an upper surface 2a of the drift layer 2; multiple junction-barrier (JB) elements 9 in the drift layer 2, facing the upper surface 2a of the drift layer 2 and each including a respective implanted region 9' of P-type and an ohmic contact 9" of metal material; and an edge termination region, or protection ring, 10 (optional), in particular an implanted region of P-type, completely surrounding the junction-barrier (JB) elements 9.

Schottky diodes 12 are formed at the interface between the drift layer 2 and the anode metallization 8. In particular, Schottky (semiconductor-metal) junctions are formed by portions of the drift layer 2 in direct electrical contact with respective portions of the anode metallization 8.

The region of the MPS device 1 including the JB elements 9 and the Schottky diodes 12 (i.e., the region contained within the protection ring 10) is an active area 4 of the MPS device 1.

FIGS. 2 to 5 illustrate, in lateral section view, steps of processing a wafer 20 of semiconductor material, to obtain the MPS device 1 of FIG. 1.

With reference to FIG. 2, the wafer 20 comprises the substrate 3, of SiC, having the first type of conductivity (N). On the front side 3a of the substrate 3, the drift layer 2, of SiC, is formed, for example by means of epitaxial growth, having the first type of conductivity (N) and a doping concentration lower than that of the substrate 3, for example in the range $1 \cdot 10^{14}$-$5 \cdot 10^{16}$ atoms/cm³. The drift layer 2 is made in particular of 4H—SiC, but other polytypes may be used, such as 2H, 6H, 3C and/or 15R.

Then, on the upper side 2a of the drift layer 2 a hard mask 22 is formed, for example by means of deposition of a photoresist, or TEOS, or another material. The hard mask 22 has a thickness such as to shield the implant described hereinbelow with reference to this same FIG. 2. The hard mask 22 thus formed extends in a region of the wafer 20 wherein, in successive steps, the active area 4 of the MPS device 1 will be formed.

In top plan view, on the XY plane, the hard mask 22 covers the regions of the upper side 2a of the drift layer 2 which will form the Schottky diodes 12 and leaves exposed the regions of the upper side 2a of the drift layer 2 which will form the implanted regions 9'.

A step of implanting doping species (for example, boron or aluminum), having the second type of conductivity (P), is then carried out, exploiting the hard mask 22 (the implant is indicated in the figure by arrows 24). During such step of implanting, the protection ring 10, not shown in FIG. 3, is also formed.

With reference to FIG. 3, the mask 22 is removed and a thermal annealing step is carried out for the diffusion and activation of the implanted doping species. The thermal annealing is, for example, carried out at a temperature higher than 1600° C. (for example, in the range 1700-1900° C. and in some cases even higher). Following the thermal annealing, the implanted regions 9' have a concentration of doping species approximately in the range $1 \cdot 10^{17}$ atoms/cm³-$1 \cdot 10^{20}$ atoms/cm³.

A Nickel deposition is carried out exclusively at the implanted regions 9', in particular using a Silicon Oxide mask (not shown) to cover surface regions of wafer 20 other than the implanted regions 9'. A successive thermal annealing at high temperature (proximate to 1000° C. for a time interval in the range 1 minute-120 minutes) allows forming ohmic contacts 9″ of Nickel Silicide, by chemical reaction between the deposited Nickel and the Silicon of the drift layer 2. In fact, the deposited Nickel reacts with the surface material of the drift layer 2 forming $Ni_2Si$ (i.e., the ohmic contact), while the Nickel in contact with the oxide of the mask does not react. Successively, a step of removing the unreacted metal and the mask is carried out.

Successively, FIG. 4, a step of forming the cathode contact is carried out, including forming the ohmic contact 6 and the metallization 16 illustrated in FIG. 1. This may include a step in which the wafer 20 is rotated, so as to be able to process the back side of the same.

Forming the cathode contact in this process step is preferable since the front side of the wafer 20 does not have an anode metallization thus preventing unwanted interface reactions between metal and semiconductor, and an electrical degradation of the Schottky diodes 12.

An interface layer 26 of metal material, such as Nickel, is deposited on the surface 3b of the substrate 3. The interface layer 26 is deposited for example by means of sputtering and has a thickness approximately in the range 10 nm-500 nm. Then, a thermal annealing at high temperature (in the range 900-1000° C. for a time interval in the range 1 minute-120 minutes), allows forming the ohmic contact 6, favoring the formation of Nickel Silicide ($Ni_2Si$) by chemical reaction between the deposited Nickel and the Silicon of the substrate 3.

Then, FIG. 5, the wafer 20 is rotated again, and the processing of the front of the wafer 20 is continued to complete the formation of the MPS device 1, with lithography and etching steps to deposit and shaping the anode metallization 8 (this step may include, in a per se known way, the use of one or more deposition masks, and processing steps of the wafer 20 at high temperatures). A plurality of semiconductor-metal junctions of Schottky type are thus formed between the anode metallization 8 and the regions of the drift layer 2 having the first type of conductivity (N). The anode metallization 8, acting as an anode contact terminal, is also formed. A passivation layer of the anode metallization may also be formed in a known manner (not shown in figure).

Successively, the wafer is rotated again for the processing of the back. A further deposition of metal (e.g., Al or Cu, or alloys or compounds such as Ti/NiV/Ag or Ti/NiV/Au) on the ohmic contact 6 forms the cathode metallization 16.

Multiple MPS devices 1 may be (and typically are) formed on the same wafer 20. A final step of wafer singulation is carried out to physically insulate one MPS device 1 from another.

It is apparent from what described with reference to FIGS. 2-5 that the various handling steps of the wafer 20, to flip it several times so as to alternately process the front and the back of the wafer 20, may lead to damage the wafer 20 and/or the structures formed on the two sides. This effect is greater the smaller the thickness of the wafer 20.

In fact, if, as previously said, the substrate 3 is thinner so as to reduce the contribution of the same to the resistance $R_{ON}$ of the MPS device 1, the handling, lithography and processing operations at high temperatures may contribute to the cracking or warping of the wafer 20.

The Applicant has verified that the thinning of the wafer 20 might be obtained with a grinding step carried out after the steps of FIG. 3 and before the steps of FIG. 4; in this case, portions of the substrate 3, at the surface 3b, would be physically removed up to obtaining the desired final thickness (e.g., 100-110 µm). It is clear that this step, by thinning the wafer 20, would make the successive steps of flipping the wafer (after the steps of FIG. 4 and before the steps of FIG. 5) and processing the front of the wafer 20 (steps of FIG. 5) even more complex. The wafer 20 would have a total thickness of about 110 µm and, in fact, would not be further processable, or would employ excessive attention and caution.

It is apparent that the aforementioned problems, although having been discussed with explicit reference to an MPS device for convenience of discussion and better understanding, may be extended to any SiC-based device, wherein the thickness of the substrate plays a role in determining the on-state resistance ($R_{ON}$) of the device in use. In such devices, reducing the thickness of the substrate leads to an improvement in the $R_{ON}$; however, the handling and processing problems previously illustrated are similarly present and limit the freedom of action.

BRIEF SUMMARY

In various embodiments, the present disclosure provides a method for manufacturing a SiC electronic device, and a SiC electronic device, such as to overcome the drawbacks of the prior art.

According to the present disclosure, a method for manufacturing a SiC electronic device, a SiC electronic device, and a system for manufacturing the SiC electronic device are provided.

BRIEF DESCRIPTION OF THE SEVERAL VIEWS OF THE DRAWINGS

For a better understanding of the present disclosure, preferred embodiments thereof are now described, purely by way of non-limiting example, with reference to the accompanying drawings, in which.

DETAILED DESCRIPTION

The present disclosure will be described with specific reference to a Merged-PN-Schottky (MPS) device; however, as will be apparent from the following description, the present disclosure generally applies to any SiC-based electronic device.

Figure 1:
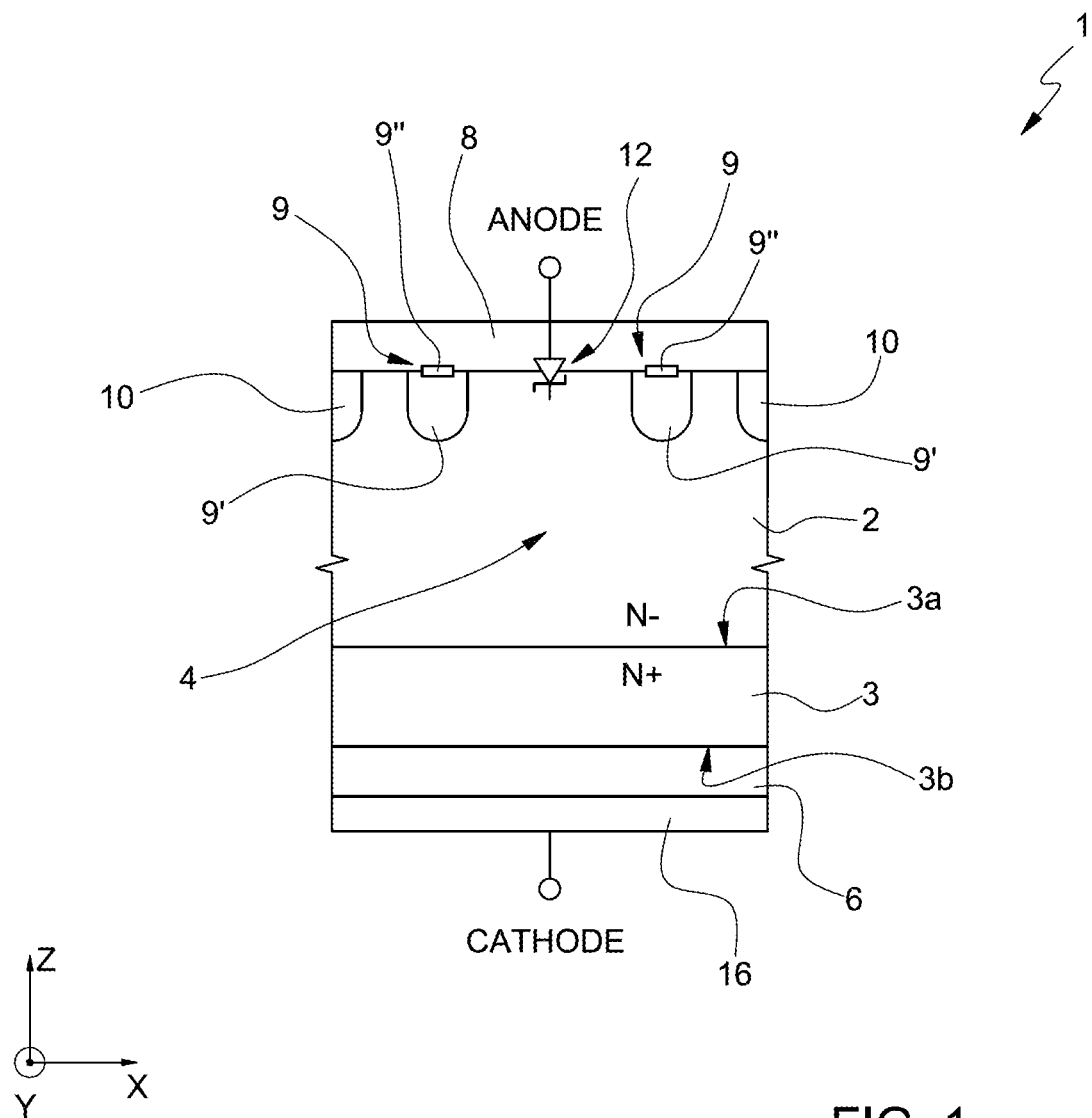
FIG. 1 shows, in cross-section view, an MPS device according to a known embodiment.
Figure 2:
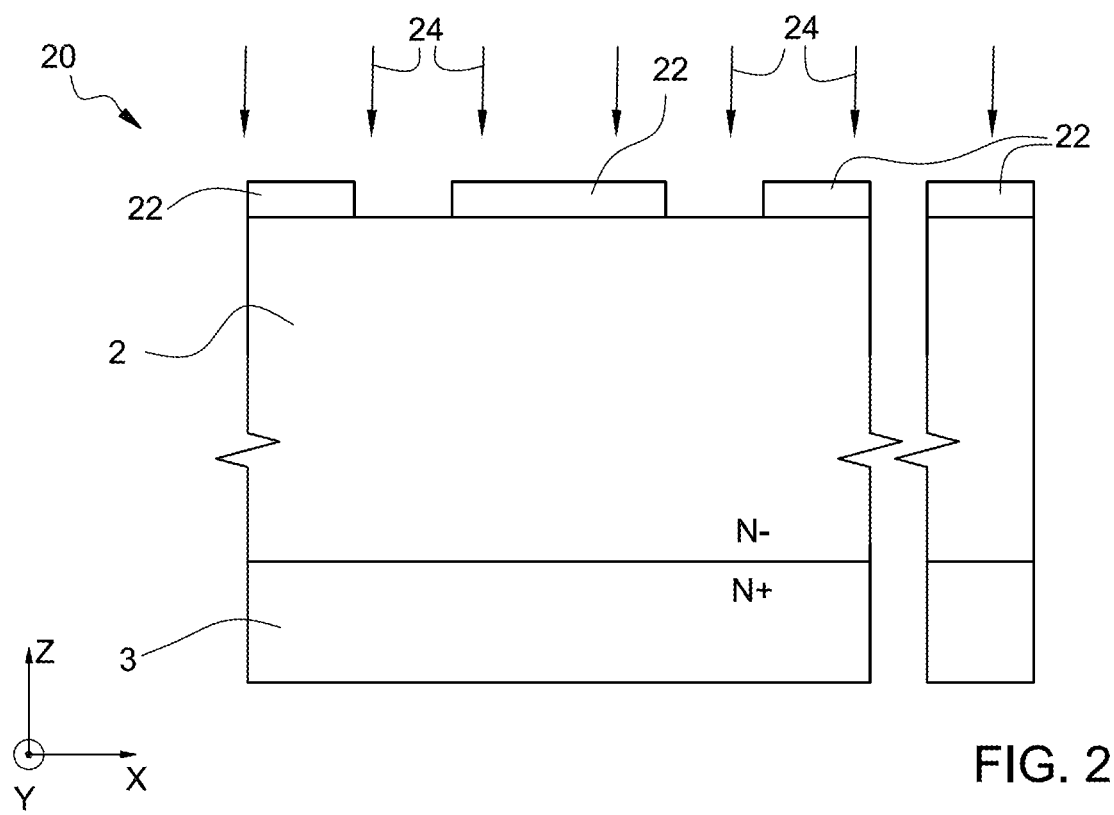
FIGS. 2-5 show known steps of manufacturing the device of FIG. 1.
Figure 3:
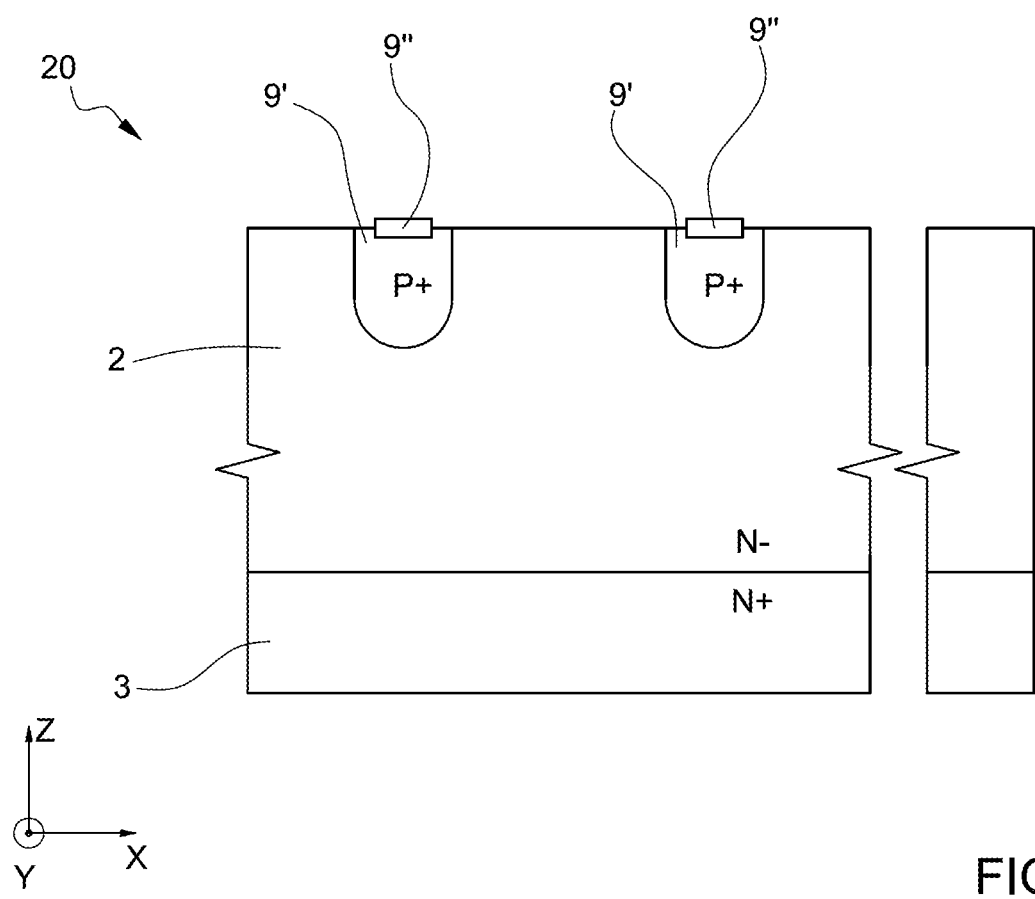
Figure 4:
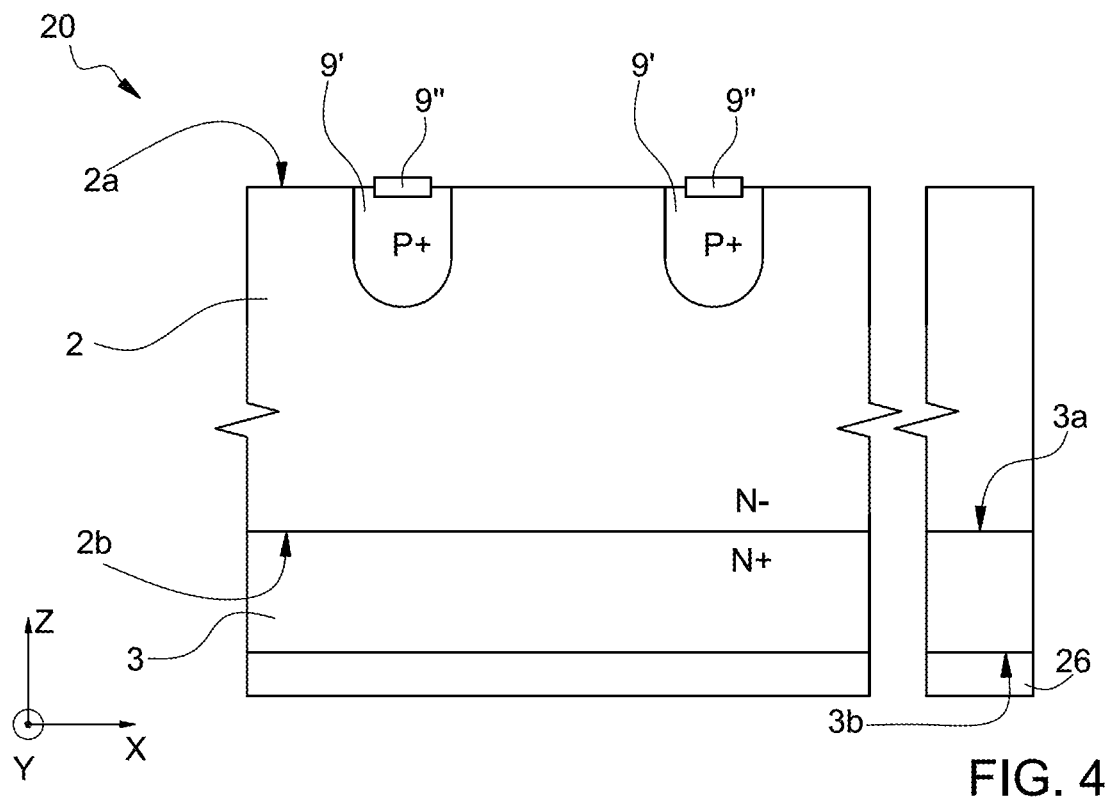
Figure 5:
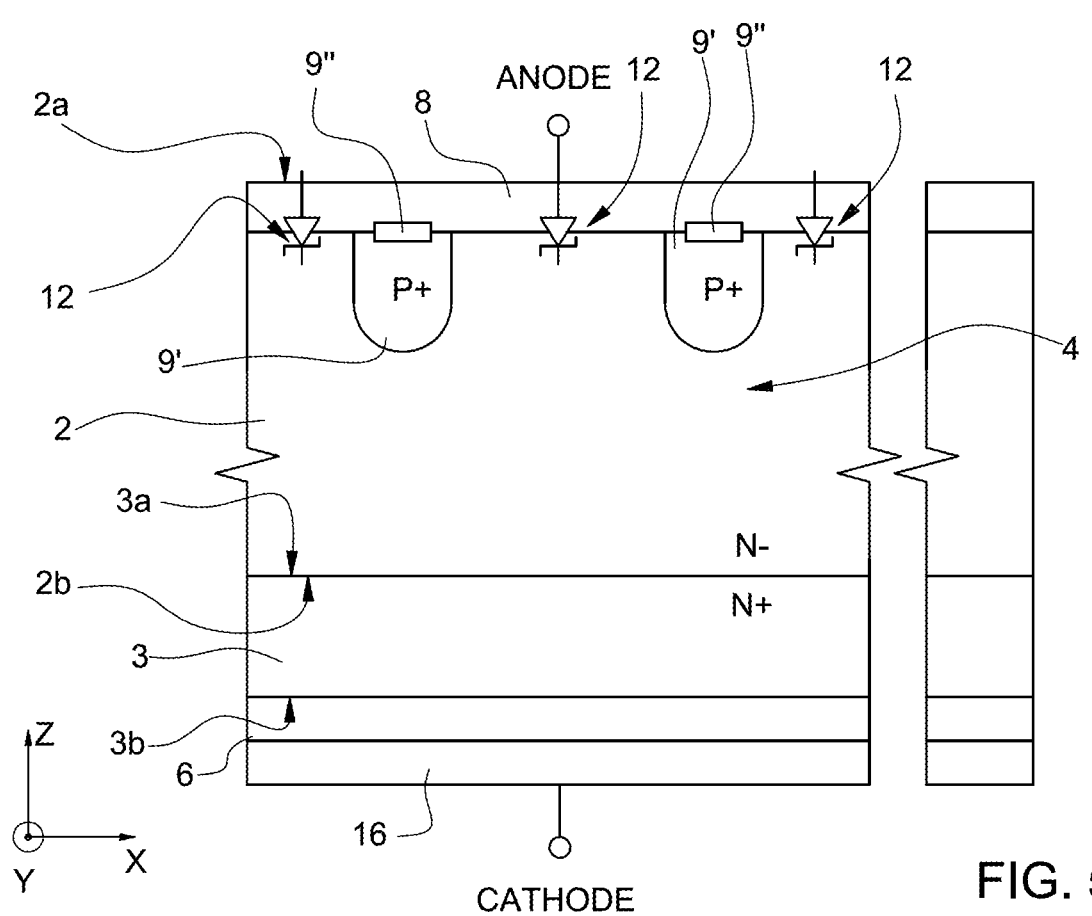
Figure 6:
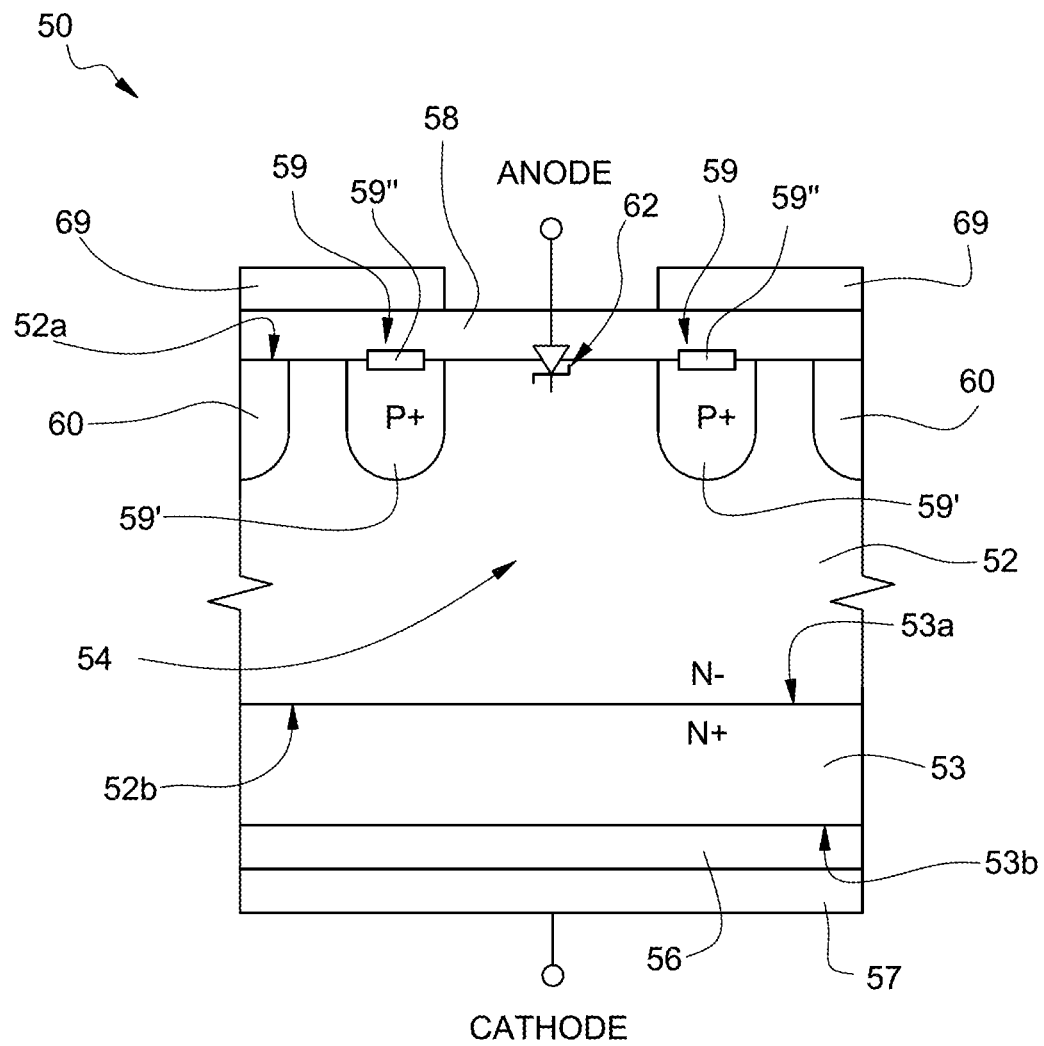
FIG. 6 shows, in cross-section view, an MPS device according to an embodiment of the present disclosure.

FIG. 6 shows, in lateral section view in a Cartesian (tri-axial) reference system of axes X, Y, Z, a Merged-PN-Schottky (MPS) device 50 according to an aspect of the present disclosure.

The MPS device 50 includes: a substrate 53, of N-type SiC, having a first doping concentration, provided with a surface 53a opposite to a surface 53b, and thickness in the range 70 µm-180 µm, more particularly in the range 100 µm-120 µm, for example equal to 110 µm; a drift layer (grown in an epitaxial manner) 52, of N-type SiC, having a second doping concentration lower than the first doping concentration, extending on the surface 53a of the substrate 53, and a thickness in the range 5-10 µm; an ohmic contact region or layer 56 (with formation of compounds of $Ti_xC_y$, $Ti_xSi_y$ and $Ti_xSi_yC_z$-type), extending on the surface 53b of the substrate 53; a cathode metallization 57, for example of Ti/NiV/Ag or Ti/NiV/Au, extending on the ohmic contact region 56; an anode metallization 58, for example of Ti/AlSiCu or Ni/AlSiCu, extending on an upper surface 52a of the drift layer 52; a passivation layer 69 on the anode metallization 58, to protect the latter; multiple junction-barrier (JB) elements 59 in the drift layer 52, facing the upper surface 52a of the drift layer 52 and each including a respective implanted region 59' of P-type and an ohmic contact 59" of metal material; and an edge termination region, or protection ring, 60 (optional), in particular an implanted region of P-type, completely surrounding the junction-barrier (JB) elements 59.

One or more Schottky diodes 62 are formed at the interface between the drift layer 52 and the anode metallization 58, laterally to the implanted regions 59'. In particular, Schottky (semiconductor-metal) junctions are formed by portions of the drift layer 52 in direct electrical contact with respective portions of the anode metallization 58.

The region of the MPS device 50 including the JB elements 59 and the Schottky diodes 62 (i.e., the region contained within the protection ring 60) is an active area 54 of the MPS device 50.

According to an aspect of the present disclosure, as previously said, the ohmic contact region 56 includes Titanium Silicide (with formation of compounds of $Ti_xC_y$, $Ti_xSi_y$, and $Ti_xSi_yC_z$-type), and is obtained by depositing Titanium on the surface 53b of the substrate 53 and thermally generating a chemical reaction between the Titanium thus deposited and the material of the substrate 53. The chemical reaction, obtained at temperatures in the range 1400-2600° C., favors the formation of Titanium compounds of the $Ti_xC_y$, $Ti_xSi_y$, and $Ti_xSi_yC_z$-type, making the ohmic contact region 56 particularly stable. The steps of forming the ohmic contact region 56 are described below, with explicit reference to the steps of manufacturing the MPS device 50 (FIGS. 7-13).

Figure 7:
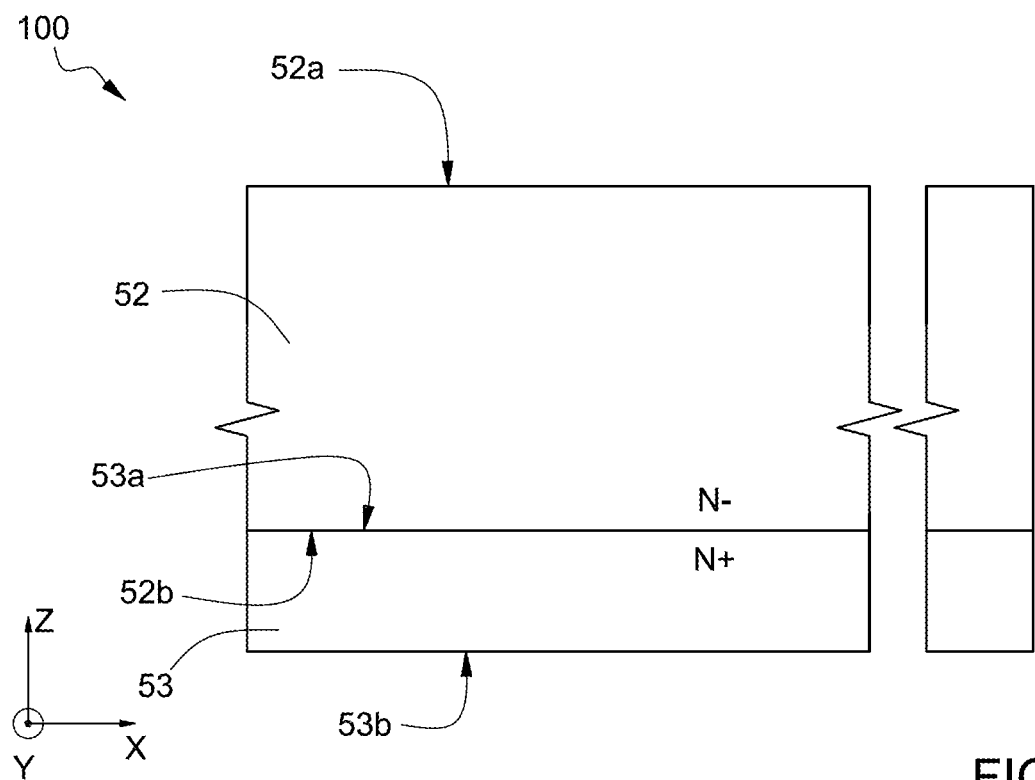
FIGS. 7-13 show known steps of manufacturing the device of FIG. 6, according to an embodiment of the present disclosure.

With reference to FIG. 7, a wafer 100, including a substrate 53 of SiC (in particular 4H—SiC, however other polytypes may be used such as, but not exclusively, 2H—SiC, 3C—SiC and 6H—SiC), is arranged.

The substrate 53 has a first type of conductivity (in this embodiment a dopant of an N-type), and is provided with a front surface 53a and a back surface 53b, being opposite to each other along Z axis. The substrate 53 has a doping concentration in the range $1·10^{19}$–$1·10^{22}$ atoms/cm$^3$.

The front of the wafer 100 corresponds to the front surface 53a, and the back of the wafer 100 corresponds to the back surface 53b. The resistivity of the substrate 30 is, for example, in the range 5 mΩ·cm-40 mΩ·cm.

On the front surface 53a of the substrate 53 the drift layer 52, of Silicon Carbide having the first type of conductivity (N) and having a doping concentration lower than that of the substrate 53, for example in the range $1·10^{14}$-$5·10^{16}$ atoms/cm$^3$, is formed, for example by means of epitaxial growth. The drift layer 52 is made of SiC, in particular 4H—SiC, but other SiC polytypes may be used, such as 2H, 6H, 3C or 15R.

The drift layer 52 has a thickness defined between an upper side 52a and a lower side 52b (the latter in direct contact with the front surface 53a of the substrate 53).

Figure 8:
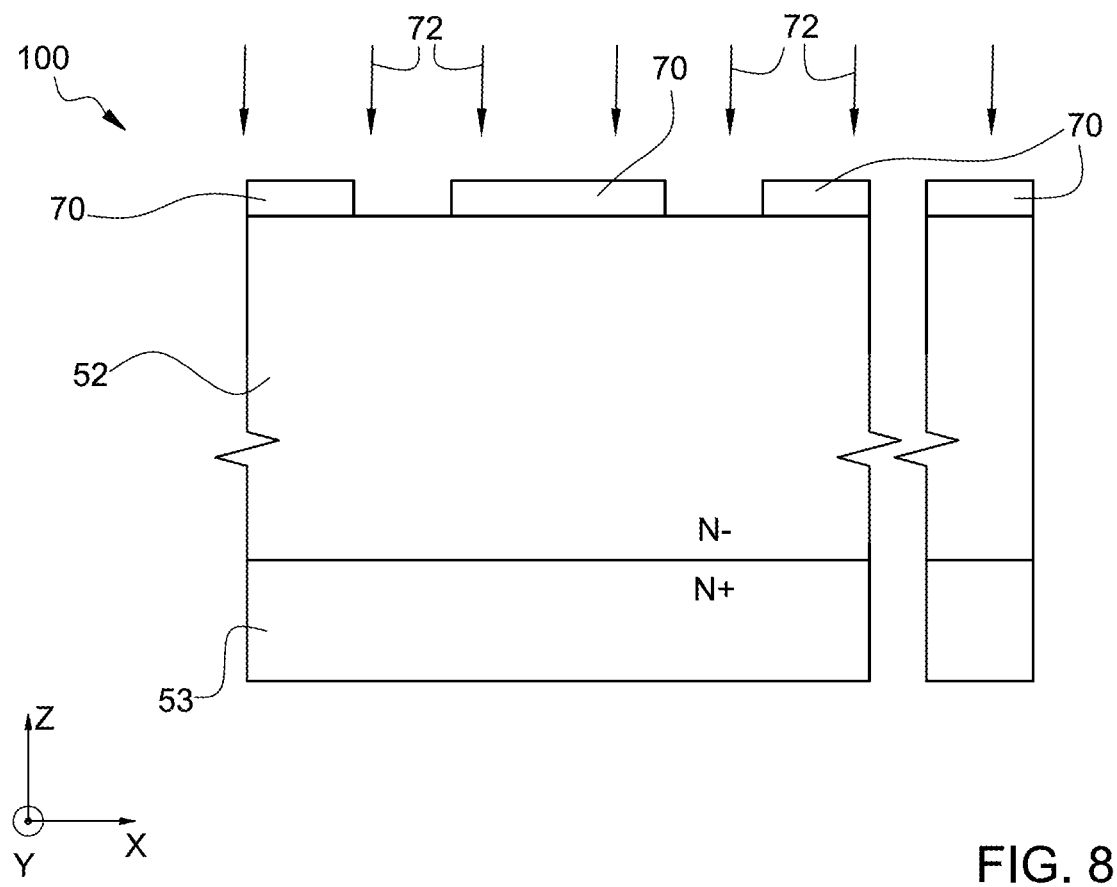

Then, FIG. 8, on the upper side 52a of the drift layer 52 a hard mask 70 is formed, for example by means of deposition of a photoresist, or TEOS, or another material suitable for the purpose. The hard mask 70 has a thickness in the range 0.5 μm-2 μm or in any case a thickness such as to shield the implant described hereinbelow with reference to the same FIG. 8. The hard mask 70 extends in a region of the wafer 100 wherein, in successive steps, the active area 54 of the MPS device 50 will be formed.

In top plan view, on the XY-plane, the hard mask 70 covers the regions of the upper side 52a of the drift layer 52 which will form Schottky cells (diodes 62) and leaves exposed the regions of the upper side 52a of the drift layer 52 which will form the implanted regions 59', already identified with reference to FIG. 6.

A step of implanting doping species (for example, boron or aluminum), having the second type of conductivity (here, P), is then carried out, using the hard mask 70 (the implant is indicated in the figure by arrows 72). During the step of FIG. 8, the protection ring 60 is also formed, if present.

Optionally, the step of implanting of FIG. 8 comprises one or more implants of doping species, having the second type of conductivity, with implant energy in the range 30 keV-400 keV and with doses in the range $1·10^{12}$ atoms/cm$^2$-$1·10^{15}$ atoms/cm$^2$, to form the implanted regions 59' with a doping concentration higher than $1·10^{18}$ atoms/cm$^3$.

Figure 9:
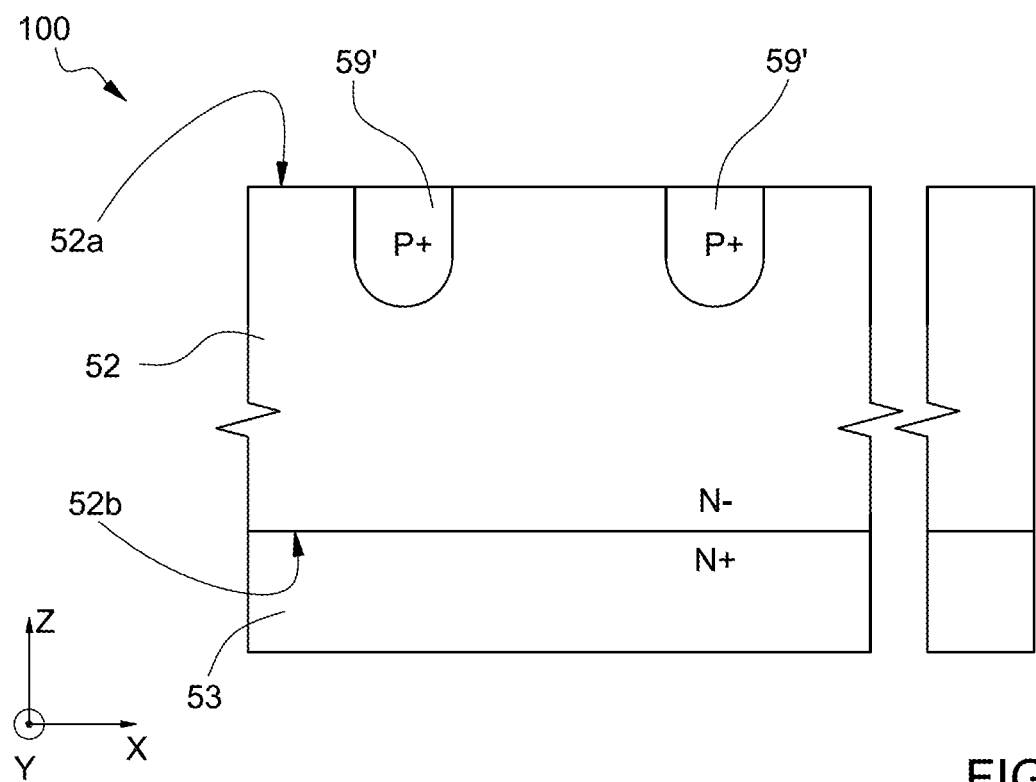

Successively, FIG. 9, the mask 70 is removed and a thermal processing (or thermal annealing) step is carried out to favor the diffusion and activation of the doping species implanted in the step of FIG. 8. The annealing is, for example, carried out at a temperature higher than 1600° C. (for example, in the range 1700° C.-1900° C. and in some cases even higher). The implanted regions 59' are thus formed, having a concentration of doping species approximately in the range $1·10^{17}$ atoms/cm$^3$-$1·10^{20}$ atoms/cm$^3$.

At the same time, the Schottky cells are also formed, being the portions of the drift layer 52 extending laterally (along X) to the implanted regions 59' or, in other words, to the portions of the drift layer 52 having been masked during the step of implanting of FIG. 8.

Figure 10:
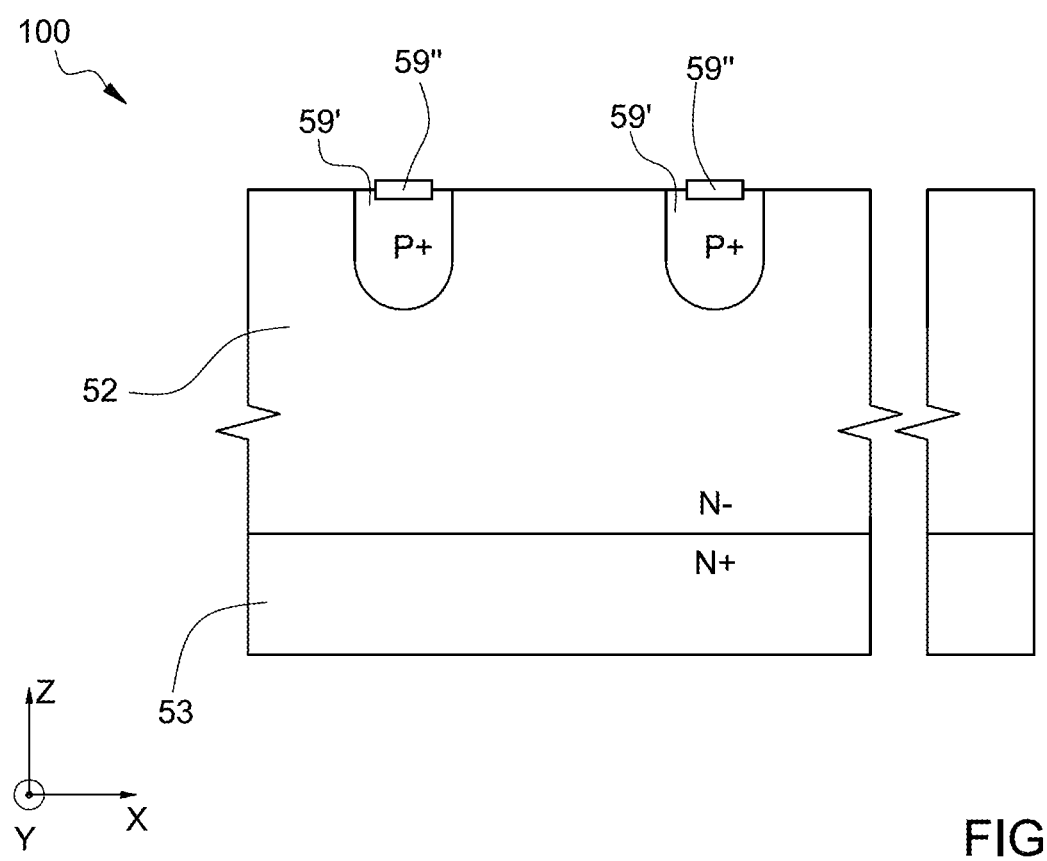

With reference to FIG. 10, the ohmic contacts 59" (here, for example, of Nickel Silicide) are formed at each implanted region 59', thereby contributing to the formation of respective JB elements 59. The implanted regions 59' visible in the cross-section view are, in a non-limiting embodiment, completely connected to each other (i.e., they form a grid). Consequently, the ohmic contacts 59" are also completely connected to each other, and are electrically connected to the implanted regions 59'.

An ohmic contact 59 is also formed at the protection ring 60 (if present), and is electrically connected to the ohmic contacts 59".

The formation of the ohmic contacts 59" includes forming a hard mask of a thin oxide (for example, in the range 100 nm-500 nm); successively the photolithography and chemical etching steps are carried out to chemically etch the regions wherein the ohmic contacts 59" are to be formed; successively, a deposition of metal material (e.g., Nickel) is carried out and a successive thermal annealing (e.g., at a temperature in the range 900° C.-1100° C. for a time interval in the range 1 minute-120 minutes) is carried out. The metal thus deposited reacts with the superficial SiC material forming an ohmic compound (e.g., Nickel Silicide), while the metal in contact with the oxide of the hard mask does not react. Successively, a step of removing the unreacted metal and the hard mask is carried out.

Figure 11:
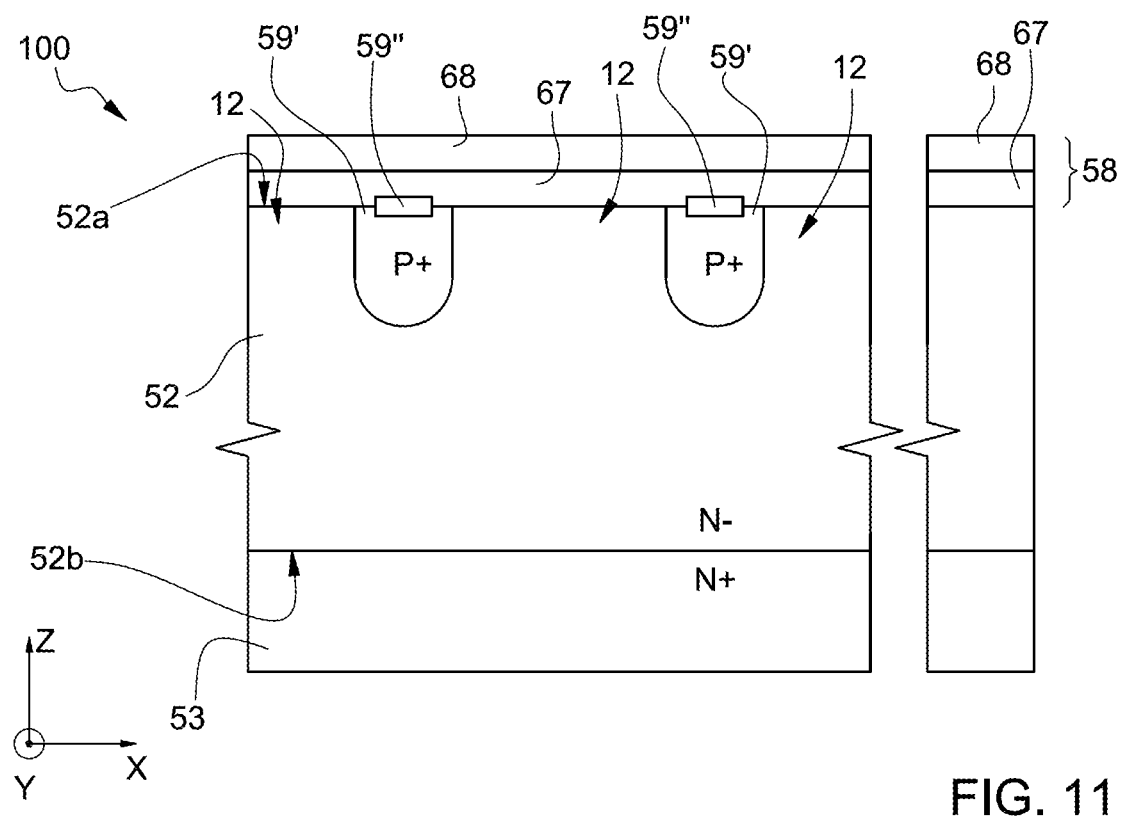

Successively, FIG. 11, a step of forming an anode terminal is carried out.

To this end, an interface layer 67 of metal material, such as e.g., Titanium, or Nickel, or Molybdenum, is deposited on the drift layer 52. The interface layer 67 is deposited by means of sputtering and has a thickness approximately in the range 10 nm-500 nm. The interface layer 67 extends in contact with the implanted regions 59' through the ohmic contacts 59" and with the exposed regions of the drift layer 52 (that is, the Schottky cells). In particular, the interface layer 67 contributes to the formation of a Schottky contact/Schottky barrier with the exposed regions of the drift layer 52 and to the formation of the junction-barrier (JB) elements with the implanted regions 59' through the ohmic contacts 59".

Successively, a further metal layer 68 is formed on the upper part of, and in direct contact with, the interface layer 67. The metal layer 68, for example, is of aluminum or copper and has a thickness of a few microns, for example in the range 1-10 µm.

The assembly made up of the interface layer 67 and the metal layer 68 forms the anode metallization 58 already discussed with reference to FIG. 6.

A plurality of semiconductor-metal junctions of Schottky-type (Schottky diodes 12) are similarly formed between the anode metallization 58 and the regions of the drift layer 52 having the first type of conductivity (N), as indicated in FIG. 11.

In an alternative embodiment (not shown), the interface layer 67 is omitted, such that the metal layer 58 extends in direct contact with the drift layer 52.

Figure 12:
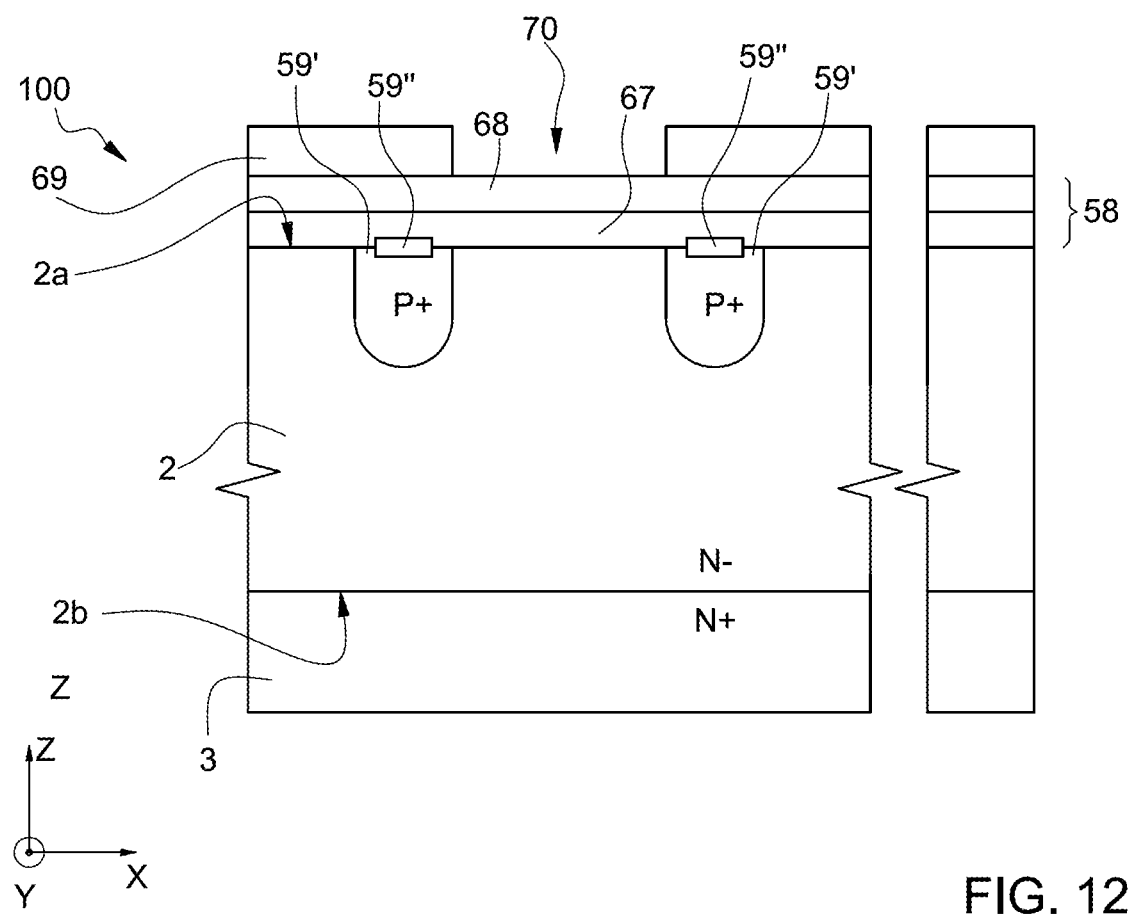

With reference to FIG. 12, a passivation layer 69 (e.g., of polyimide) is also formed on the anode metallization 58, and shaped so as to open one or more regions of electrical contact 70, to contact the anode metallization 58.

Figure 13:
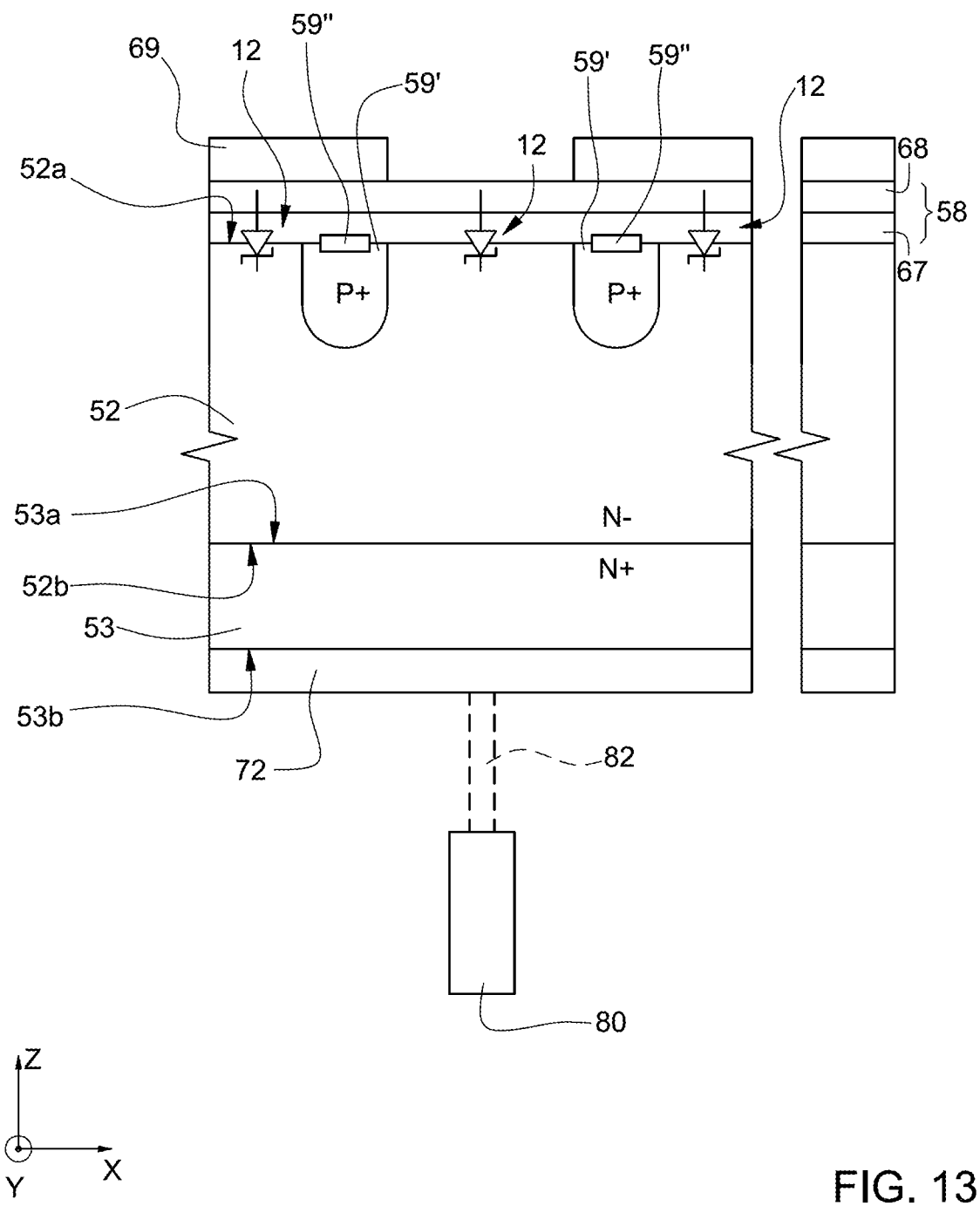

Then, FIG. 13, a cathode contact terminal is formed on the back of the wafer 100, that is at the back surface 53b of the substrate 53.

The formation of the cathode comprises forming a metallization at the back surface 53b of the substrate 53 and an ohmic contact region or layer between the metallization and the back surface 53b. The ohmic contact layer is for favoring the electrical contact between the metallization and the substrate 53.

In detail, the formation of the ohmic contact comprises depositing, for example by means of sputtering, an intermediate layer 72 (in particular of Titanium) on the back surface 53b of the substrate 53. The intermediate layer 72 has thickness, for example, in the range 10 nm-200 nm, in particular equal to 100 nm.

The generation of the ohmic contact may be accomplished by the Titanium of the layer 72 reacting with the Carbon and the Silicon of the substrate 53. In order to generate, at the intermediate layer 72, the thermal budget necessary for generating $Ti_xC_y$, $Ti_xSi_y$, and $Ti_xSi_yC_z$ compounds, without thermally impacting the structures present at the front side of the wafer 100, a LASER source 80 for generating a beam 82 such as to locally heat the intermediate layer 72 up to temperatures in the range 1400-2600° C., for example equal to 2000° C., is used.

The reaching of such temperature, substantially uniform for the entire thickness (along Z) of the intermediate layer 72 at the superficial portion of the intermediate layer 72 on which the LASER beam 82 hits, is such as to favor the generation of Titanium compounds of $Ti_xC_y$, $Ti_xSi_y$ and $Ti_xSi_yC_z$-type, transforming the intermediate layer 72 into the ohmic contact region 56 identified in FIG. 6. The transformation of the intermediate layer 72 from Ti to Ti compounds of the $Ti_xC_y$, $Ti_xSi_y$ and $Ti_xSi_yC_z$-type occurs by heating the entire usable surface of the intermediate layer 72, in particular at, or above, the melting temperature of the material of the intermediate layer 72, such as to cause a complete or partial melting of the intermediate layer 72. By "usable surface" it is meant here the superficial portion of the intermediate layer 72 being desired to act as an ohmic contact (e.g., defined by design); the usable surface might not correspond to the entire surface of the intermediate layer 72 (for example possible portions of the intermediate layer 72 lateral with respect to the active area 54 are not of interest during the use of the MPS device 50 as they do not take part in the conduction of electric charge).

The intermediate layer 72 thus becomes the ohmic contact region or layer 56 previously described, that is having ohmic and non-Schottky properties.

Then, the formation of the cathode metallization 57 on the intermediate layer 72/ohmic contact 56 is carried out, for example depositing, by means of sputtering, Ti/NiV/Ag or Ti/NiV/Au.

The MPS device 50 of FIG. 6 is thus obtained.

The LASER 80 is, for example, an excimer UV LASER. Other types of LASERs are usable, including LASERs with wavelength in the visible region.

The configuration and operating parameters of the LASER 80, optimized to achieve the purpose of the present disclosure in the case of intermediate layer 72 of Titanium (in order to generate an ohmic contact based on Titanium), are as follows:
  wavelength in the range 290-370 nm, in particular 310 nm;
  pulse duration in the range 100 ns-300 ns, in particular 160 ns;
  number of pulses in the range 1-10, in particular 4;
  energy density in the range 1-4 J/cm², in particular 3 J/cm².

The temperatures reached at the intermediate layer are in the range of 1400-2600° C., in particular 2000° C.; more in particular, the operating parameters of the LASER are set such that the temperature reached at the intermediate layer 72 is equal to, or higher than, the melting temperature of layer 72. Thanks to the use of LASER 80, the above temperatures can be reached irrespective of the thickness of the layer 72.

In order to improve the characteristics of on-state resistance ($R_{ON}$) of the MPS device 50 (that is, reduce the value of $R_{ON}$), it is possible to thin the wafer 100 by means of a grinding step of the substrate 53, at the back surface 53a. This grinding step is carried out after the steps of FIG. 12 and before the steps of FIG. 13, that is before forming the ohmic contact 56. The thinning of the substrate 53 proceeds up to reaching a thickness desired for the latter, for example in the range 70 µm-180 µm.

On the same wafer 100, multiple MPS devices 50 may be formed. In this case, a final singulation step of the die is carried out to physically insulate one MPS device 50 from another.

According to further embodiments of the present disclosure, the ohmic contact region 56 may be of a material other than Titanium compounds ($Ti_xC_y$, $Ti_xSi_y$ and $Ti_xSi_yC_z$).

For example, the formation of the ohmic contact region 56 may be carried out depositing (or forming with another technique) an intermediate layer 72 of metal material other than Titanium at the back surface 53b of the substrate 53 and heating (in particular at or above a melting temperature of the material of layer 72, for example, at temperatures in the range 1400-2600° C.) such intermediate layer 72 by means of the LASER beam 82 so as to favor the formation of an ohmic compound or alloy between the material of the intermediate layer 72 and the material of the substrate 53, similarly to what previously described.

For example, considering the substrate 53 of Sic:
the intermediate layer 72 is of Mo, and the thermal annealing by means of LASER favors the generation of $Mo_xC_y$, $Mo_xSi_y$, and $Mo_xSi_yC_z$; or
the intermediate layer 72 is of Ta, and the thermal annealing by means of LASER favors the generation of $Ta_xC_y$, $Ta_xSi_y$, and $Ta_xSi_yC_z$; or
the intermediate layer 72 is of W, and the thermal annealing by means of LASER favors the generation of $W_xC_y$, $W_xSi_y$; or
the intermediate layer 72 is of Co, and the thermal annealing by means of LASER favors the generation of $Co_xSi_y$; or
the intermediate layer 72 is of Ni, and the thermal annealing by means of LASER favors the generation of $Ni_xSi_y$.

From an examination of the characteristics of the disclosure provided according to the present description, the advantages thereof are apparent.

In particular, the proposed solution allows the formation of the ohmic contact on the back of power devices manufactured on very thin (≤180 mm) wafers of SiC. According to this solution, after the deposition and definition of the anode metallization and the passivation on the front of the wafer, the substrate is thinned to the desired thickness, without the process limits of the prior art (e.g., a thicknesses greater than 180 μm). Successively, a layer of Ti is deposited on the back of the wafer and the formation of the ohmic contact is performed by means of an annealing laser process, preserving the structures previously made on the front of the wafer. With this solution the following benefits are obtained:
simplification of the process flow (in our solution, in fact, the thinning of the wafer is carried out after completing the processing of the front of the device);
better quality of the ohmic contact (only one process step following the formation of the ohmic contact);
reduction of the risk of cracking the wafer (only one rotation of the wafer and only three process steps following the thinning of the wafer);
no lithographic limit after the step of thinning the wafer;
significant reduction of the resistive contribution of the substrate to the total Ron of the device.

In addition, the use of Titanium as starting material for the successive formation of the ohmic contact based on Titanium has several advantages with respect to the use of Nickel according to the prior art. For example: continuity and uniformity of the reacted layer, absence of agglomerates of C within the reacted layer, mechanical strength of the reacted layer, due to the presence of compounds of $Ti_xC_y$, $Ti_xSi_y$, and $Ti_xSi_yC_z$-type.

Finally, it is clear that modifications and variations may be made to what has been described and illustrated here, without thereby departing from the scope of protection of the present disclosure, as defined in the attached claims.

In particular, as already observed previously, the present disclosure is not limited to the formation of an ohmic contact on the back of an MPS device, but extends to the formation of a back ohmic contact in a generic vertical conduction electronic device, such as for example Schottky Diodes, JBS Diodes, MOSFETs, IGBTs, JFETs, DMOS, etc.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device, comprising:
a substrate of silicon carbide (SiC), the substrate having a front side and a back side opposite to each other along a direction;
a structural layer of SiC extending at the front side of the substrate, the structural layer having a first side opposite the front side of the substrate;
active regions extending in the first side of the structural layer, the active regions configured to generate or conduct electric current during the use of the electronic device;
a first electric terminal extending on the structural layer, the first electric terminal entirely covering the first side of the structural layer;
a passivation layer entirely separated from the structural layer by the first electric terminal, the passivation layer covering the active regions along a first direction and having a central opening;
an intermediate layer of compounds of a first metal at the back side of the substrate, the first metal including at least one of Titanium, Molybdenum, Tantalum, Tungsten, or Cobalt; and
a second electric terminal extending on the intermediate layer.

2. The device according to claim 1, wherein the intermediate layer includes Titanium and said compounds of the first metal include $Ti_xC_y$, $Ti_xSi_y$, and $Ti_xSi_yC_z$.

3. The device according to claim 1, wherein the substrate has a thickness equal to or less than 180 μm.

4. The device according to claim 1, wherein the substrate is one of: 4H—SiC, 6H—SiC, 3C—SiC, 15R—SiC.

5. The device according to claim 1, wherein said electronic device is one of: a Merged-PN-Schottky diode, Schottky Diodes, JBS Diodes, MOSFETs, IGBTs, JFETs, or DMOS.

6. The device according to claim 5, wherein the electronic device is a Merged-PN-Schottky (MPS) diode and wherein:
the structural layer is a drift layer of the MPS diode having a first conductivity;
the active regions include a doped region having a second conductivity opposite to the first conductivity;
the first electric terminal is an anode terminal in electrical contact with the doped region and in direct electrical contact with the drift layer laterally to the doped region, so as to form a junction-barrier (JB) diode with the doped region and a Schottky diode with the drift layer; and
the second electric terminal is a cathode terminal,
wherein the JB diode and the Schottky diode define an active area of the MPS diode.

7. A device, comprising:
a substrate of silicon carbide (SiC), the substrate having a front side and a back side opposite to each other along a first direction;
a structural layer of SiC on the front side of the substrate having a first side opposite the front side of the substrate;
active regions extending in the structural layer, each active region including:
a doped region having a P+ conductivity and a first surface coplanar with the first side of the structural layer, the first surface having a first dimension along a second direction transverse to the first direction;

a metal ohmic contact in the doped region, the metal contact having a second dimension along the second direction smaller than the first dimension and a second surface opposite a third surface along the first direction;

a first electric terminal on the structural layer;

a first passivation layer on the first electric terminal, the entire first passivation layer being separated from the structural layer by the first electric terminal, the passivation layer being a first distance from the second surface and a second distance from the first surface, the second distance being greater than the first distance;

a first metal on the back side of the substrate, the first metal including titanium compounds of $Ti_xC_y$, $Ti_xSi_y$, and $Ti_xSi_yC_z$-type; and a second electric terminal on a first metal.

8. The device of claim 7 wherein the first metal has a thickness in the range of 10 and 200 nanometers.

9. The device of claim 7 wherein the active regions are P+ and the structural layer is N—.

10. The device of claim 9, comprising a protection ring around the active regions, in the structural layer.

11. A device, comprising:

a substrate of SiC;

a structural layer of silicon carbide (SiC) on a front side of the substrate of SiC, the structural layer having an N-conductivity, the structural layer having a first side opposite the front side of the substrate along a first direction;

a plurality of doped regions having a P+ conductivity in the structural layer, each of the plurality of doped regions having a first surface coplanar with the first side of the structural layer, each first surface having a first dimension along a second direction transverse to the first direction;

a plurality of metal ohmic contacts in the plurality of doped regions, each of the plurality of metal contacts having a second dimension along the second direction smaller than the first dimension;

a p-type protection ring around the plurality of doped regions;

a first electric terminal entirely covering the first side of the structural layer;

a passivation layer on the first electric terminal, the passivation layer being entirely separated from the structural layer by the first electric terminal;

an opening in the passivation layer, the opening exposing a surface of the first electric terminal;

an intermediate layer of a metal compound at a back side of the substrate, the back side opposite to the front side of the substrate; and a second electric terminal on the intermediate layer.

12. The device of claim 11 wherein the metal compound includes titanium compounds of $Ti_xC_y$, $Ti_xSi_y$, and $Ti_xSi_yC_z$-type.

13. The device of claim 11, wherein the intermediate layer has a thickness in the range of 10 and 200 nanometers.

14. The device of claim 11, wherein the substrate has a thickness equal to or less than 180 µm.

15. The device of claim 11 wherein the intermediate layer is in direct contact with the substrate and the second electric terminal.

16. The device of claim 15 wherein the first electric terminal includes an interface layer in direct contact with the structural layer.

17. The device of claim 16 wherein the first electric terminal includes a metal layer in direct contact with the interface layer.

18. The device of claim 11, wherein the opening in the passivation layer is central over the first electric terminal.

19. The device of claim 11, wherein the plurality of ohmic contacts each include a first surface opposite a second surface, each first surface of each ohmic contact being a first distance from the passivation layer along the first direction smaller than a second distance between the first side of the structural layer and the passivation layer along the first direction.

20. The device of claim 19, wherein each second surface is a third distance from the passivation layer along the first direction greater than the second distance.

* * * * *